US012581772B2

(12) United States Patent
Alberi et al.

(10) Patent No.: US 12,581,772 B2
(45) Date of Patent: Mar. 17, 2026

(54) STRAIN BALANCED DIRECT BANDGAP ALUMINUM INDIUM PHOSPHIDE QUANTUM WELLS FOR LIGHT EMITTING DIODES

(71) Applicants: Alliance for Energy Innovation, LLC, Golden, CO (US); MicroLink Devices, Inc., Niles, IL (US); South Dakota Board of Regents, Rapid City, SD (US)

(72) Inventors: Kirstin Alberi, Denver, CO (US); Christopher Leo Stender, Glenview, IL (US); Scott Phillip Ahrenkiel, Golden, CO (US)

(73) Assignees: Alliance for Energy Innovation, LLC; MicroLink Devices, Inc.; South Dakota Board of Regents

( * ) Notice: Subject to any disclaimer, the term of this patent is extended or adjusted under 35 U.S.C. 154(b) by 1062 days.

(21) Appl. No.: 17/651,838

(22) Filed: Feb. 21, 2022

(65) Prior Publication Data

US 2022/0271194 A1 Aug. 25, 2022

Related U.S. Application Data

(60) Provisional application No. 63/151,299, filed on Feb. 19, 2021.

(51) Int. Cl.
H10H 20/815 (2025.01)
H10H 20/811 (2025.01)
(Continued)

(52) U.S. Cl.
CPC ........ H10H 20/815 (2025.01); H10H 20/811 (2025.01); H10H 20/812 (2025.01);
(Continued)

(58) Field of Classification Search
None
See application file for complete search history.

(56) References Cited

U.S. PATENT DOCUMENTS

| | | | | | |
|---|---|---|---|---|---|
| 5,212,706 | A | * | 5/1993 | Jain | H01S 5/4043 |
| | | | | | 372/50.1 |
| 6,233,265 | B1 | * | 5/2001 | Bour | H10H 20/01335 |
| | | | | | 372/45.01 |

(Continued)

OTHER PUBLICATIONS

Altieri, P. et al., "Internal quantum efficiency of high-brightness AlGaInP light-emitting devices," Journal of Applied Physica, vol. 98, 2005, 3 pages.

(Continued)

*Primary Examiner* — Bilkis Jahan
(74) *Attorney, Agent, or Firm* — Neal S. Vickery

(57) ABSTRACT

Described herein are optoelectronic devices and methods incorporating strain balanced direct bandgap $Al_xIn_{1-x}P$ multiple quantum wells. The described devices are strain balanced in that the net strain between the ordered quantum wells and barriers is low, or in some cases zero. Advantageously, the described devices may be specifically designed for higher efficiency than existing $Al_xIn_{1-x}P$ and may be grown on commercially available GaAs substrates.

17 Claims, 15 Drawing Sheets

(51) Int. Cl.
  *H10H 20/812* (2025.01)
  *H10H 20/824* (2025.01)
  *H10H 20/81* (2025.01)
(52) U.S. Cl.
  CPC ...... *H10H 20/824* (2025.01); *H10H 20/8242*
  (2025.01); *H10H 20/81* (2025.01)

(56) References Cited

U.S. PATENT DOCUMENTS

| | | | |
|---|---|---|---|
| 9,543,468 B2 | 1/2017 | Alberi et al. | |
| 2002/0072140 A1* | 6/2002 | Finder | B82Y 20/00 |
| | | | 257/E31.034 |
| 2004/0099872 A1* | 5/2004 | McGill | H10H 20/824 |
| | | | 257/94 |
| 2006/0049415 A1* | 3/2006 | Liao | H10H 20/813 |
| | | | 257/97 |
| 2009/0086170 A1* | 4/2009 | El-Ghoroury | H01S 5/18 |
| | | | 353/38 |
| 2017/0104128 A1* | 4/2017 | Yeh | H10H 20/825 |
| 2020/0288548 A1 | 9/2020 | Ndione et al. | |

OTHER PUBLICATIONS

Beanland, R. et al., "A study of surface cross-hatch and misfit dislocation structure in In0.15Ga0.85As/GaAs grown by chemical beam epitaxy," Journal of Crystal Growth, vol. 149, 1995, 11 pages.

Christian, T.M. et al., "Amber-green light-emitting diodes using order-disorder AlxIn1—xP heterostructures," Journal of Applied Physics, vol. 114, 6 pages.

Chui, H. et al., "High-Efficiency A1GaInP Light-Emitting Diodes," Semiconductors and Semimetals, Optoelectronics Division, Hewlett-Packard Company, vol. 64, Chapter 2, 2000, 80 pages.

France, R.M. et al., "Reduction of crosshatch roughness and threading dislocation density in metamorphic GaInP buffers and GaInAs solar cells," Journal of Applied Physics, vol. 111, 2012, 7 pages.

Matioli and Weisbuch, "Active Region Part A. Internal Quantum Efficiency in LEDs," Chapter 6, III-Nitride Based Light Emitting Diodes and Applications, Topics in Applied Physics 126, T-Y Seong et al. editors, 2013, 32 pages.

Mukherjee, K. et al., "Growth, microstructure, and luminescent properties of direct-bandgap InAlP on relaxed InGaAs on GaAs substrates," Journal of Applied Physics, vol. 113, 2013, 8 pages.

Mukherjee, K. et al., "Effects of dislocation strain on the epitaxy of lattice-mismatched A1GaInP layers," Journal of Crystal Growth, vol. 392, 2014, 7 pages.

Schubert and Rheinlander, "Direct-gap reduction and valence-band splitting of ordered indirect-gap AlInP2 studied by dark-field spectroscopy," Physical Review B, vol. 54, No. 24, Dec. 15, 1996—II, 4 pages.

Schulte, Kevin L. et al., "Guided Optimization of Phase-Unstable III-V Compositionally Graded Buffers by Cathodoluminescence Spectrum Imaging," IEEE Journal of Photovoltaics, vol. 10, No. 1, Jan. 2020, 8 pages.

Liu, J. et al., "Semimetals for high-performance photodetection," Nature Materials, Perspective, vol. 19, Aug. 2020, 8 pages.

Wang, Q. et al., "Ultrafast Broadband Photodetectors Based on Three-Dimensional Dirac Semimetal Cd3As2," ACS Nano Letters, vol. 17, 2017, 8 pages.

* cited by examiner

Energy Barrier Values

C   Device Example 1

D Device Example 2

Depth into Device (μm)

100

130

110

110

130

120

120

120

STRAIN BALANCED DIRECT BANDGAP ALUMINUM INDIUM PHOSPHIDE QUANTUM WELLS FOR LIGHT EMITTING DIODES

CROSS-REFERENCE TO RELATED APPLICATIONS

This application claims priority from U.S. Provisional Patent Application No. 63/151,299, filed on Feb. 19, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

The present application is related to optoelectronic devices and methods of making optoelectronic devices using $Al_xIn_{1-x}P$. This application is related to issued U.S. Pat. No. 9,543,468 to Alberi, K. et al, which is hereby incorporated by reference in its entirety. Strain balanced multiple quantum wells and barriers can be integrated into a direct bandgap $Al(x)In(1-x)P$ light-emitting diodes (LEDs) emitting at red or amber wavelengths. Excessive electron loss in conventional red and amber $(Al_xGa_{1-x})_{0.5}In_{0.5}P$ LEDs limits their efficiency, which is improved by the devices and methods described herein.

SUMMARY

Described herein are optoelectronic devices and methods incorporating strain balanced direct bandgap $Al_xIn_{1-x}P$ multiple quantum wells. The described devices are strain balanced in that the net strain between atomically ordered quantum wells and barriers with respect to an underlying cladding layer or substrate is low, or in some cases zero. Advantageously, the described devices may be specifically designed for higher efficiency than existing $(Al_xGa_{1-x})_{0.5}In_{0.5}P$ and may be grown on commercially available GaAs substrates.

In an aspect, provided is an optoelectronic device comprising: a well layer of CuPt atomically ordered $Al_xIn_{1-x}P$ quantum wells; a barrier layer of ordered $Al_xIn_{1-x}P$ quantum barriers in electronic communication with the well layer; wherein the well layer and the barrier layer are strain-balanced. The device may comprise a plurality of well layers and a plurality of barrier layers, optionally, in an alternating configuration. The degree of CuPt atomic ordering can range from zero to the highest theoretical value for the given $Al_xIn_{1-x}P$ alloy composition used.

The device may further comprise a $Al_xIn_{1-x}P$ clad layer. The device may further comprise a disordered $Al_xIn_{1-x}P$ n-type clad layer and a disordered $Al_xIn_{1-x}P$ p-type clad layer. In some embodiments, one or more ordered layers may be zero ordered.

Strain balanced may refer to a net strain between the well layers and the barrier layers that is, less than or equal to 20%, less than or equal to 15%, less than or equal to 10%, less than or equal to 5%, less than or equal to 2.5%, less than or equal to 1%, substantially zero, or optionally, zero. The well layers may have a non-zero compressive strain and the barrier layers may have a non-zero tensile strain. The well layers may have an Al fraction less than the Al fraction of the barrier layers.

The well layers, the barrier layers or both may be capable of being grown on a GaAs substrate, for example, using a metamorphic buffer.

The well layers, the barrier layers or both further comprising Ga and have the formula $(Al_{1-y}Ga_y)_xIn_{1-x}P$. The well layers, the barrier layers or both may have a Ga fraction less than or equal to 0.25, 0.2, 0.15, 0.1, 0.05, or optionally, 0.025.

The $Al_xIn_{1-x}P$ clad layers may further comprise Ga and have the formula $(Al_{1-y}Ga_y)_xIn_{1-x}P$. The $Al_xIn_{1-x}P$ cladding, quantum well and/or quantum barriers layers may have a Ga fraction less than or equal to 0.25, 0.2, 0.15, 0.1, 0.05, or optionally, 0.025.

The present application may further be directed towards LEDs that emit light in the amber or red range of the visible spectrum. This may refer to light having a wavelength of 560 to 650 nm. More specifically, a narrow amber LED may emit light in the range of 570-590 nm and a narrow red LED may emit light in the rage of 610-630 nm. Light in these wavelength ranges may have advantages over other wavelengths including broader white light and blue light. Studies have shown that LED lights that emit a large portion of light at blue wavelengths can create a disorienting glare for drivers. The bright lights can also disrupt natural circadian rhythms, during which, according to one report, "melatonin blood concentrations rise, body temperature drops, sleepiness grows, and hunger abates, along with several other responses." The lights also have an adverse effect on nocturnal wildlife. Scientists have found that migrating birds are attracted to unnatural lighting, which often results in injuries or death when they collide with reflections on buildings or other structures. High-intensity light pollution has also been linked to low survival rates for hatchling sea turtles and even to inhibited migration rates for salmon and other fish.

In an aspect, provided is a method for making any of the optoelectronic devices described herein.

BRIEF DESCRIPTION OF DRAWINGS

Some embodiments are illustrated in referenced figures of the drawings. It is intended that the embodiments and figures disclosed herein are to be considered illustrative rather than limiting.

In FIG. 1A, the direct bandgap energies for $Al_xIn_{1-x}P$ alloys with different degrees of CuPt—B atomic ordering, $\eta$, are included. $\eta_1$ refers to the case where ordering shifts $E_\Gamma$ by 100 meV, and $\eta_2$ refers to the case where ordering shifts $E_\Gamma$ by 200 meV. The energy for amber light emission at 590 nm is also marked by a horizontal line. Energy differences between the direct bandgap energies corresponding to 590 nm emission and the indirect bandgap are marked with vertical arrows. Direct ($CBM_\Gamma$) and indirect ($CBM_X$) conduction band minima and valence band maximum (VBM) trends for FIG. 1C $Al_xIn_{1-x}P$ and FIG. 1d $(Al_xGa_{1-x})_{0.5}In_{0.5}P$ alloys as a function of Al fraction, x. Energies are references to the VBM of AlP and $Ga_{0.5}In_{0.5}P$, respectively. Vertical arrows mark the energy difference between $CBM_G$ at the direct-indirect bandgap crossover composition and the $CBM_G$ values for the relevant compositions for 590 nm emission marked in graphs FIG. 1A and FIG. 1B. Energetic barrier heights to electron loss to FIG. 1E CBM$_X$ and FIG. 1F electron leakage into the cladding layers, assuming cladding layer compositions at the direct-indirect crossover. Insets schematically depict these offsets. Trends are shown for both Al$_x$In$_{1-x}$P (orange) and (Al$_x$Ga$_{1-x}$)$_{0.5}$In$_{0.5}$P (blue). The cases of $\eta=0$ and $\eta_1$ and $\eta_2$ degrees of ordering in Al$_x$In$_{1-x}$P are also displayed. Specific energies are marked for 590 nm (amber) and 615 nm (red) emission. Energies of $3k_BT$ for three temperatures are also marked by horizontal lines for reference.

FIG. 2A. LED device schematic. FIG. 2B. Al$_x$In$_{1-x}$P bandgap energies as a function of Al fraction and degree of ordering. The compositions of the cladding (C), quantum well (W) and quantum barrier (B) are marked with squares and diamonds for device examples 1 and 2, respectively. FIG. 2C. Conduction band alignment (top), valence band alignment (middle) and bandgap energies (bottom) for device example 1, in which ordering in the quantum well and quantum barrier layers shifted CBM$_G$ by 100 meV. FIG. 2D. Conduction band alignment (top), valence band alignment (middle) and bandgap energies (bottom) for device example 2, in which ordering in the quantum well and quantum barrier layers shifted CBM$_G$ by 200 meV.

FIG. 3B. ECCI image of the In$_x$Ga$_{1-x}$As metamorphic buffer surface. FIG. 3C. Diffraction patterns of the top clad (top), MQW (middle) and bottom clad (bottom) layers. FIG. 3D. Cross-sectional TEM image of the MQW layers. FIG. 3E. SIMS profiles of dopant (Si, Zn), impurity (O) and P. The approximate depths of the interfaces between layers are also marked.

FIG. 4A. Modulated reflectance (top), room temperature photoluminescence (middle) and variable temperature photoluminescence (bottom) spectra from an Al$_x$In$_{1-x}$P device. Both the room temperature modulated reflectance and photoluminescence data are accompanied by fits to the spectra (dotted lines). Vertical lines indicate the energies extracted from those fits as well as attribution to the layers associated with the transitions. FIG. 4B. Room temperature photoluminescence spectra of three different Al$_x$In$_{1-x}$P devices with slightly different quantum well compositions. FIG. 4C. Ratios of integrated photoluminescence intensity measured at room temperature and low temperature (20 K) for the three Al$_x$In$_{1-x}$P devices in FIG. 4B, as well as an (Al$_x$Ga$_{1-x}$)$_{0.5}$In$_{0.5}$P device. FIG. 4D. Electroluminescence spectra from the same device as in FIG. 4A as a function of drive current. Measurements were performed in increments of 10 mA, from 10 mA to 100 mA. FIG. 4E Electroluminescence power measured in an integrating sphere for the device in FIG. 4D as a function of drive current.

REFERENCE NUMERALS

Figures 1A, 1B:
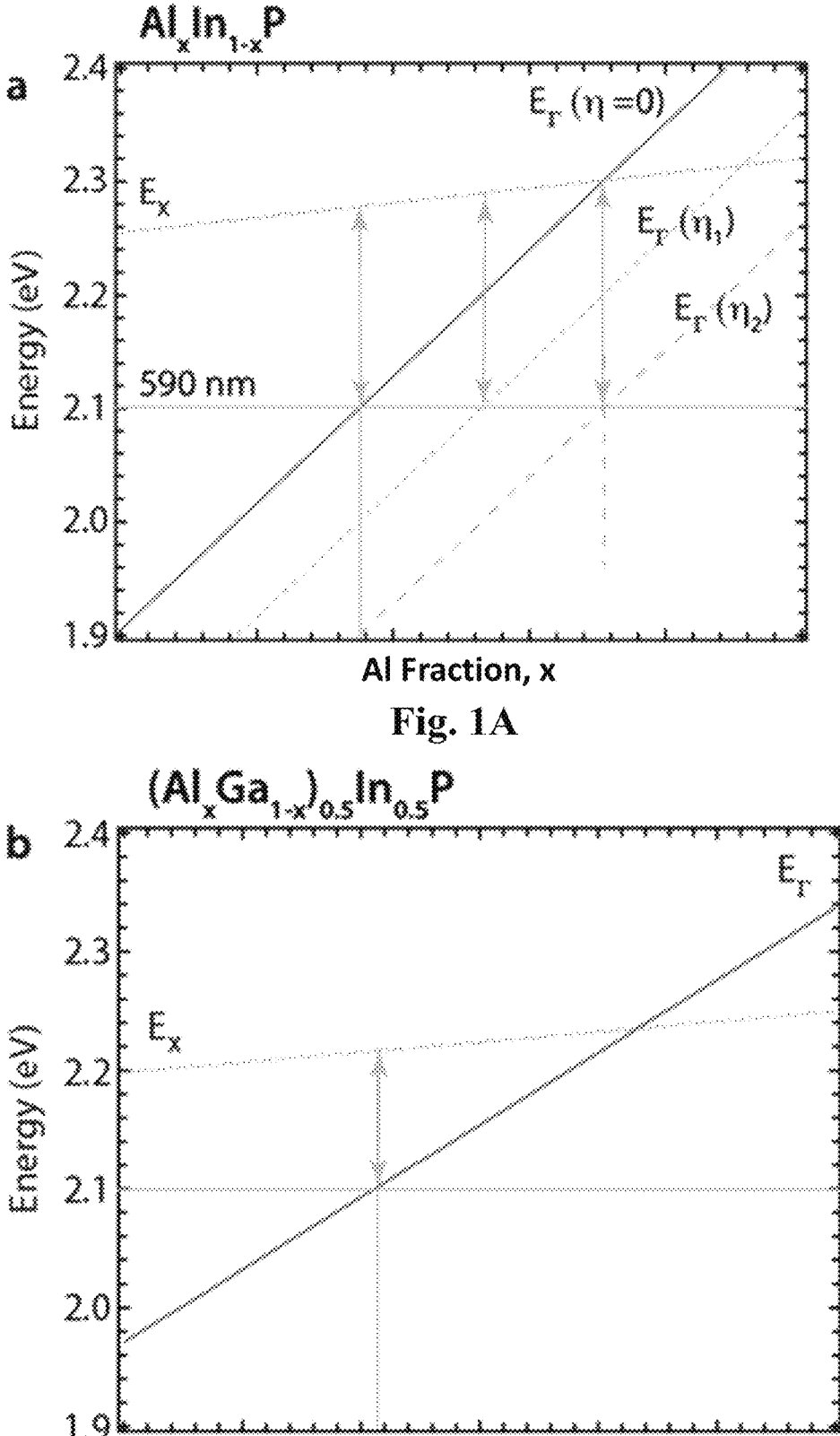
FIGS. 1A-1F illustrate band alignments and offsets in $Al_xIn_{1-x}P$ and $(Al_xGa_{1-x})_{0.5}In_{0.5}P$ semiconductor systems. Direct ($E_\Gamma$) and indirect ($E_X$) bandgap energies of FIG. 1A $Al_xIn_{1-x}P$ and FIG. 1B $(Al_xGa_{1-x})_{0.5}In_{0.5}P$ alloys as a function of Al fraction, x.

100 Optoelectronic device
110 Quantum well layer

120 Quantum barrier layer
130 Clad layer

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The provided discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

$Al_xIn_{1-x}P$ Multiple Quantum Well Light-Emitting Diodes

Light-emitting diodes (LEDs) are critical components of solid-state lighting products for general illumination, automotive, display and other applications. Highly energy efficient LEDs over the entire visible spectrum are needed for solid-state lighting and display products with ultra-high efficiency, color-tunable functionality or spectra tailored for specialized uses. Many of these applications will require substantial improvements in the efficiency of direct-emitting green, amber and red LEDs.

The most efficient direct-emitting red and amber LEDs realized to date have been fabricated from $(Al_xGa_{1-x})_{0.5}In_{0.5}P$ semiconductor alloys. Their compositions are lattice-matched to GaAs, permitting the light-emitting and carrier confining device layers to be grown unstrained on commercially available, large-area substrates. However, the efficiency of incumbent $(Al_xGa_{1-x})_{0.5}In_{0.5}P$ LED devices decreases as the emission wavelength is tuned from red to amber through two channels of electron loss. The first channel occurs in the quantum wells defined within the light-emitting active region when the energetic separation between the direct and indirect conduction band minima becomes small. Electrons preferentially populate the indirect conduction band minima, from which the rate of radiative recombination is much lower. The second channel is leakage of electrons out of the quantum wells due to a low energy barrier between the well and the adjacent cladding layer. Both of these electron loss mechanisms are fundamental to $(Al_xGa_{1-x})_{0.5}In_{0.5}P$.

U.S. Pat. No. 9,543,468 describes replacing $(Al_xGa_{1-x})_{0.5}In_{0.5}P$ with direct bandgap $Al_xIn_{1-x}P$. An advantage is that $Al_xIn_{1-x}P$ has a higher direct-indirect bandgap crossover energy, which results in a higher barrier to electron transfer to the indirect conduction band minima in the quantum wells for a given emission wavelength. Direct bandgap $Al_xIn_{1-x}P$ has a larger lattice constant than the GaAs substrates that are commonly used for red and amber LED fabrication and thus requires a metamorphic buffer layer to extend the lattice constant so that $Al_xIn_{1-x}P$ can be grown strain-free. The second LED design feature that was included in that patent was the use of disordered $Al_xIn_{1-x}P$ material for the cladding layers and CuPt atomically ordered $Al_xIn_{1-x}P$ material for the quantum well active regions. This design solved two problems. Ordering of the Al and In cation atoms in the CuPt configuration induces a downward shift in the conduction band edge, generating a high (100-200 meV) energy barrier to electron leakage into the disordered cladding layer. This value is higher than that typically found in $(Al_xGa_{1-x})_{0.5}In_{0.5}P$ LEDs. It also produces the conduction band offset without requiring a change in the composition or lattice constant. This second aspect is important, as producing that magnitude of offset through a composition change alone would require a difference in x of 0.05-0.1. Since the lattice constant of $Al_xIn_{1-x}P$ changes with composition, the sizeable composition difference would have introduced too much strain for the structure to withstand without generating high dislocation densities.

The aspect that was not worked out in that patent was how to define the quantum wells in the ordered $Al_xIn_{1-x}P$ active region. The lattice mismatch between the device layers and the substrate restricts traditional approaches for generating the quantum well through large changes in alloy composition alone. The ordered/disordered heterostructure only produces an offset in the conduction band, leaving no offset in the valence band. Changing the order parameter abruptly enough to define thin quantum wells may also be challenging. The present application addresses the issue of defining direct bandgap $Al_xIn_{1-x}P$ quantum wells in a device grown on a metamorphic buffer. Described herein are $Al_xIn_{1-x}P$ multiple quantum well (MQW) LED devices in which the quantum well and quantum barrier layers can have different compositions, and thus different bandgap and band offset energies, if they are strain-balanced MQWs. The band alignments within these devices are first determined and discussed in relation to traditional $(Al_xGa_{1-x})_{0.5}In_{0.5}P$ devices. An $Al_xIn_{1-x}P$ LED design is also reduced to practice, with emission wavelengths spanning a representative range (591-621 nm) for amber and red light emission. These new devices are more robust against electron loss to the indirect conduction band minima at short emission wavelengths than similar $(Al_xGa_{1-x})_{0.5}In_{0.5}P$ LEDs. Accordingly, by controlling defects, doping and impurities as well as refining the MQW design the described $Al_xIn_{1-x}P$ red and amber LED devices rival the incumbent $(Al_xGa_{1-x})_{0.5}In_{0.5}P$ technology.

Device Design

Described is the potential for an $Al_xIn_{1-x}P$ LED design to address the electron losses typically found in $(Al_xGa_{1-x})_{0.5}In_{0.5}P$ red and amber LEDs. One pathway to electron loss is the transfer of injected electrons from the direct conduction band minima ($CBM_\Gamma$) to the indirect conduction band minima at the X point ($CBM_X$) within the quantum well, which becomes more probable when the energetic separation, $\Delta E$, between the two becomes small relative to the thermal energy ($\Delta E < 3k_BT$, where $k_B$ is Boltzmann's constant). For reference, the thermal energy at 80° C. is 90 meV. FIGS. 1A-1B display the direct ($E_\Gamma$) and indirect ($E_X$) bandgap energy trends for fully disordered $Al_xIn_{1-x}P$ and $(Al_xGa_{1-x})_{0.5}In_{0.5}P$ semiconductor alloys. In the case of $Al_xIn_{1-x}P$, recent experimental measurement of the direct-indirect crossover suggests that the bandgap trends are largely linear. The well-accepted bandgap trends of $(Al_xGa_{1-x})_{0.5}In_{0.5}P$ are also approximately linear. $Al_xIn_{1-x}P$ has a direct-indirect bandgap crossover that is ~70 meV higher than that of $(Al_xGa_{1-x})_{0.5}In_{0.5}P$, providing an additional energy barrier for electron transfer to the indirect conduction band minima in the MQW.

The $Al_xIn_{1-x}P$ alloy system also exhibits spontaneous CuPt—B atomic ordering, in which the Al and In cation elements preferentially align along alternating <111> planes when grown under certain conditions. The extent of the ordering is characterized by an order parameter, $\eta$, and varies between being fully disordered ($\eta=0$) and fully ordered ($\eta=1$, in the case of $Al_{0.5}In_{0.5}P$). A principal consequence of CuPt—B ordering is a reduction in the $CBM_\Gamma$. This shift has been measured to be greater than 200 meV in direct bandgap $Al_{0.33}In_{0.67}P$ and provides an additional degree of freedom for designing the band alignments. The direct bandgap trends for hypothetical cases where the ordering shifts the $CBM_\Gamma$ by 100 meV and 200 meV, marked $E_\Gamma(\eta_1)$ and $E_G(\Lambda_2)$, respectively, are also displayed in FIG.

1A. Increasing $\eta$ has the effect of increasing the energetic offset between the direct and indirect conduction band minima for a given composition.

Figure 1C:
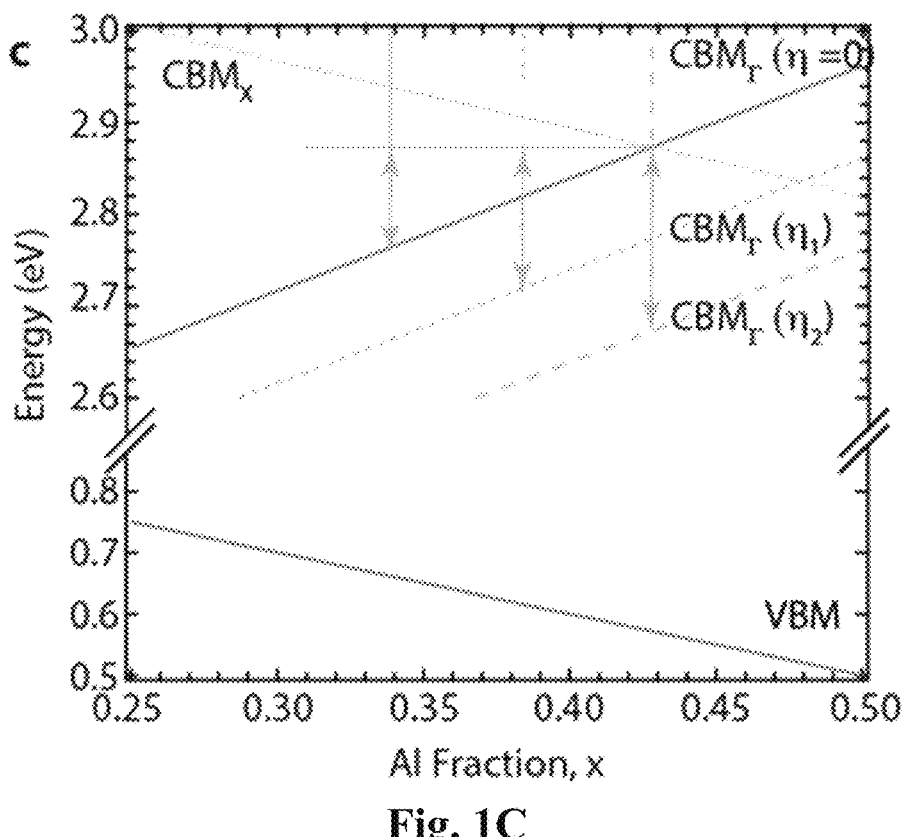
Figure 1D:
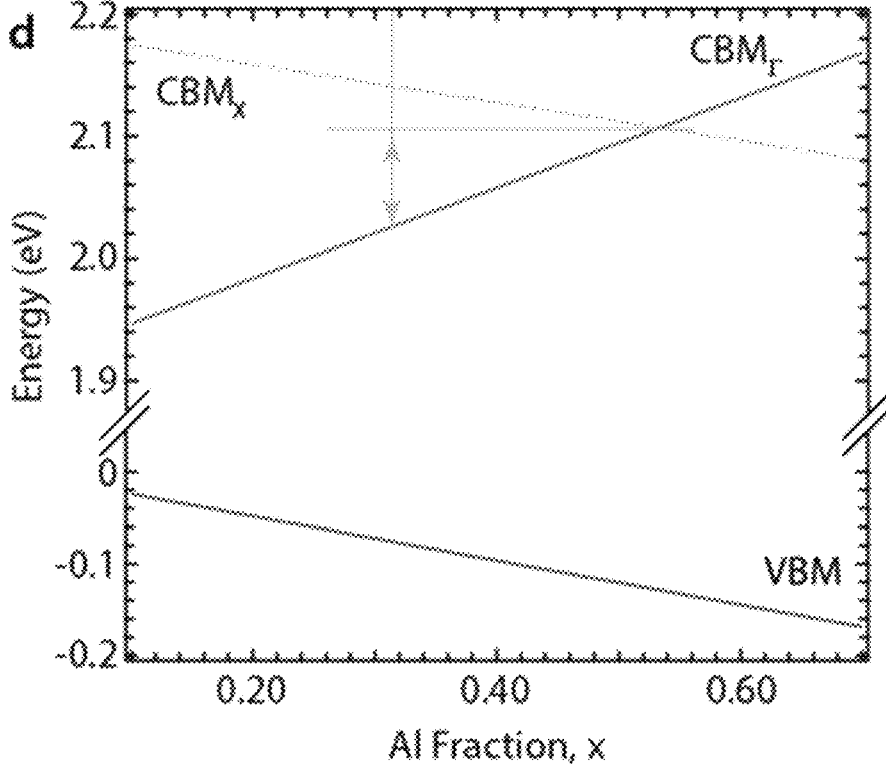

The second pathway to electron loss is leakage out of the MQW by surmounting the conduction band offsets at the MQW/cladding layer interfaces. In this case, the conduction band alignment between these two regions is the important factor. FIGS. 1C-1D display the $CBM_\Gamma$ and $CBM_X$ energies for $Al_xIn_{1-x}P$ and $(Al_xGa_{1-x})_{0.5}In_{0.5}P$ plotted relative to the valence band edges of AlP and $Ga_{0.5}In_{0.5}P$, respectively. The $CBM_\Gamma$ increases in energy with increasing Al concentration, while the $CBM_X$ decreases. The direct-indirect crossover is therefore the point at which the lowest of either minimum is at the highest absolute energy. Because this energy is also highest for $\eta=0$, fully disordered alloys with the crossover composition are the logical choice for the doped cladding layers. Large energy barriers for electron leakage out of the MQW are then constructed by pairing disordered cladding layers with ordered QWs. As an example, offsets are marked in FIG. 1C in the case of emission at 590 nm (a representative wavelength for amber emission) for MQWs with the three different degrees of ordering.

Figures 1E, 1F:
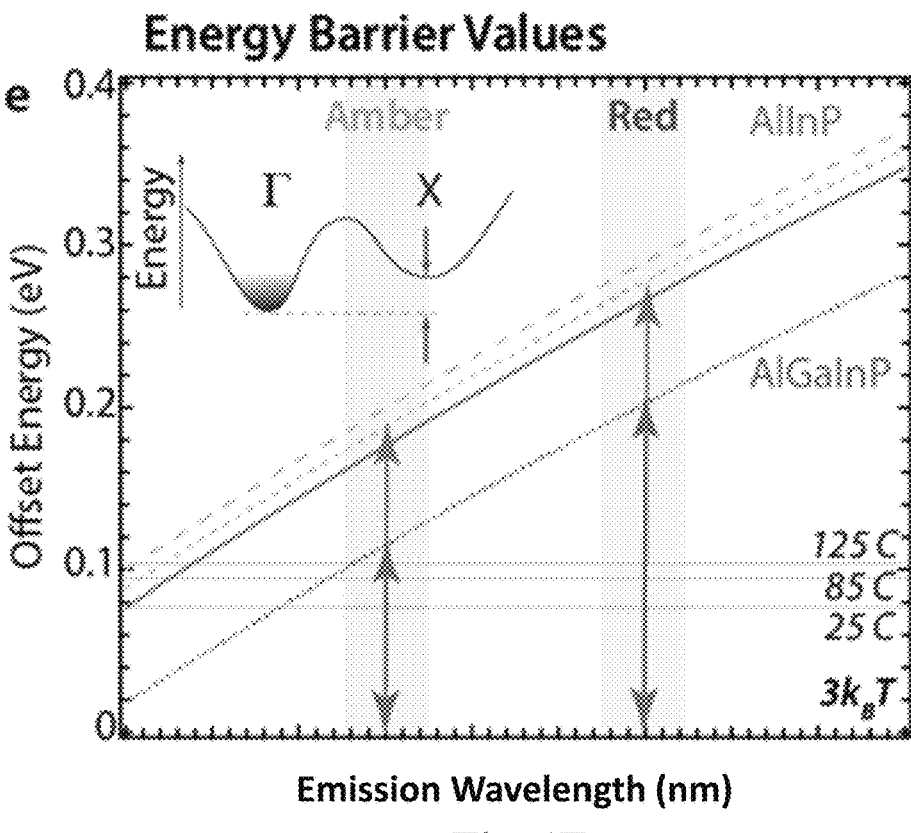

The energetic barriers to both electron loss pathways are plotted for $Al_xIn_{1-x}P$ and $(Al_xGa_{1-x})_{0.5}In_{0.5}P$ in FIGS. 1E-1F for a range of wavelengths that are relevant for amber (570-605 nm) and red (605-635 nm) emission. The $Al_xIn_{1-x}P$ energetic barriers for electron leakage from the quantum wells into the cladding layers are explicitly calculated for the case of fully disordered cladding layers and quantum wells of $\eta=0$, $\eta_1$ and $\eta_2$. For example, an $Al_xIn_{1-x}P$ quantum well designed for emission at 590 nm exhibits energetic barriers greater than $3k_BT$ for typical LED operating temperature ranges (25-125° C.), while $(Al_xGa_{1-x})_{0.5}In_{0.5}P$ does not. Higher degrees of ordering within the $Al_xIn_{1-x}P$ MQW lead to greater offsets between the MQW and cladding layer conduction band minima. Such large barrier energies will help to suppress electron loss under higher injection conditions and at higher operating temperatures compared to $(Al_xGa_{1-x})_{0.5}In_{0.5}P$.

We next describe a device designed from $Al_xIn_{1-x}P$. Although $(Al_xGa_{1-x})_{0.5}In_{0.5}P$ has lower energetic barriers to electron losses, it does exhibit two principal advantages for fabricating devices. It is lattice matched to commercially available large area GaAs substrates, and the lattice constant does not appreciably change with Al/Ga ratio, allowing the bandgap to be adjusted between layers without introducing strain. Neither of these aspects are true for $Al_xIn_{1-x}P$. Direct bandgap $Al_xIn_{1-x}P$ (x<0.43) has a larger lattice constant than GaAs, and the lattice constant changes with x. The lattice mismatch between $Al_xIn_{1-x}P$ and GaAs can be addressed by including a metamorphic buffer. The metamorphic buffer is typically designed to gradually change the lattice constant from the value of the substrate to the value of the device layers. When done in a controlled manner, many of the misfit dislocations generated by strain relaxation are confined within the buffer, and the density of threading dislocations that reach the device layers remains low. Generating large band offsets between the quantum barrier and quantum well layers of the MQW also requires additional consideration, as the composition is no longer a parameter that can be freely changed. Our solution is to use a strain-balanced MQW design. In this configuration, the cladding layers are grown strain free, the quantum wells are grown in compression (with a lower Al fraction), and the quantum barriers are grown in tension (with a higher Al fraction).

Figure 2A:
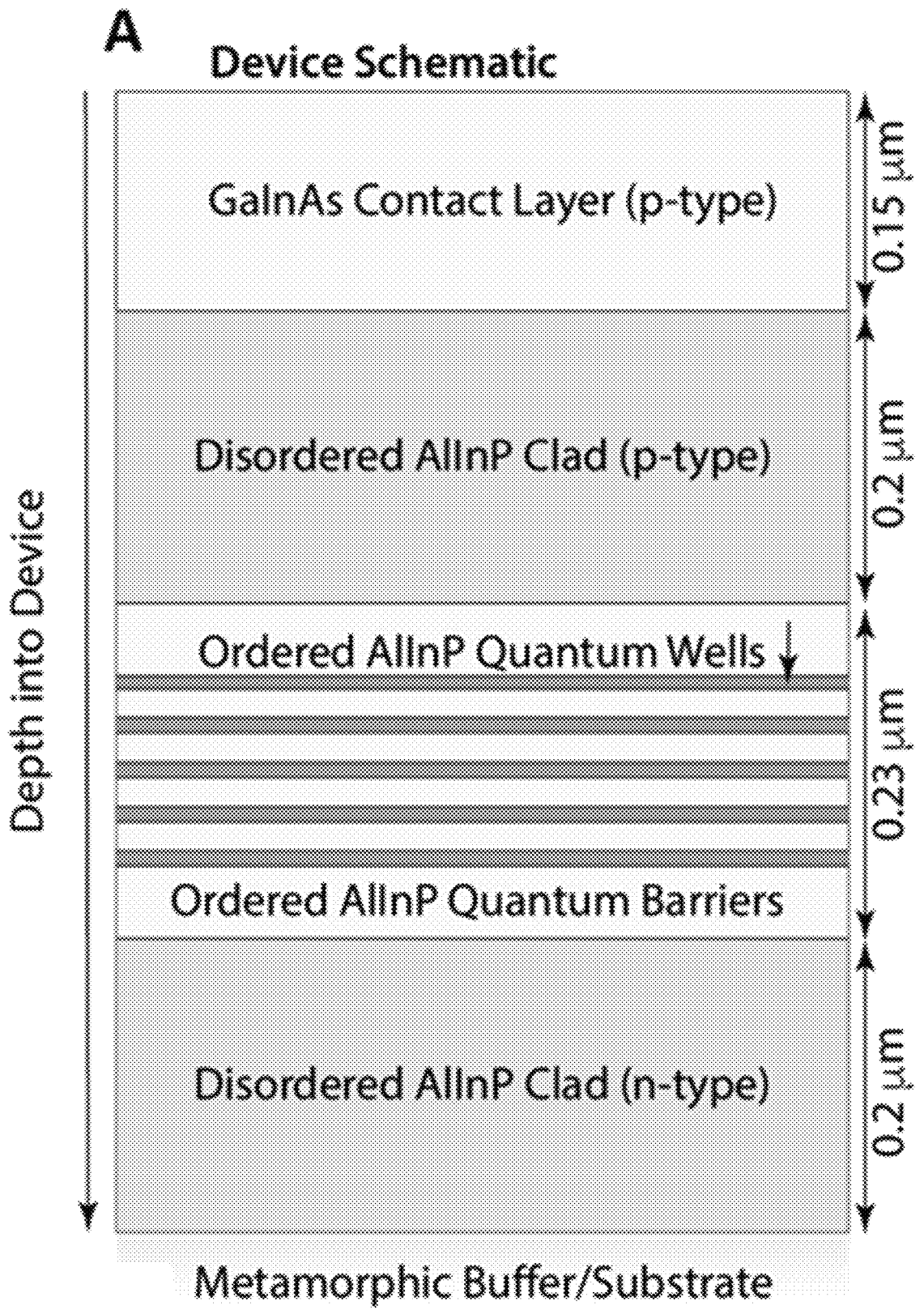
FIGS. 2A-2D illustrate a Al$_x$In$_{1-x}$P device design.
Figure 2B:
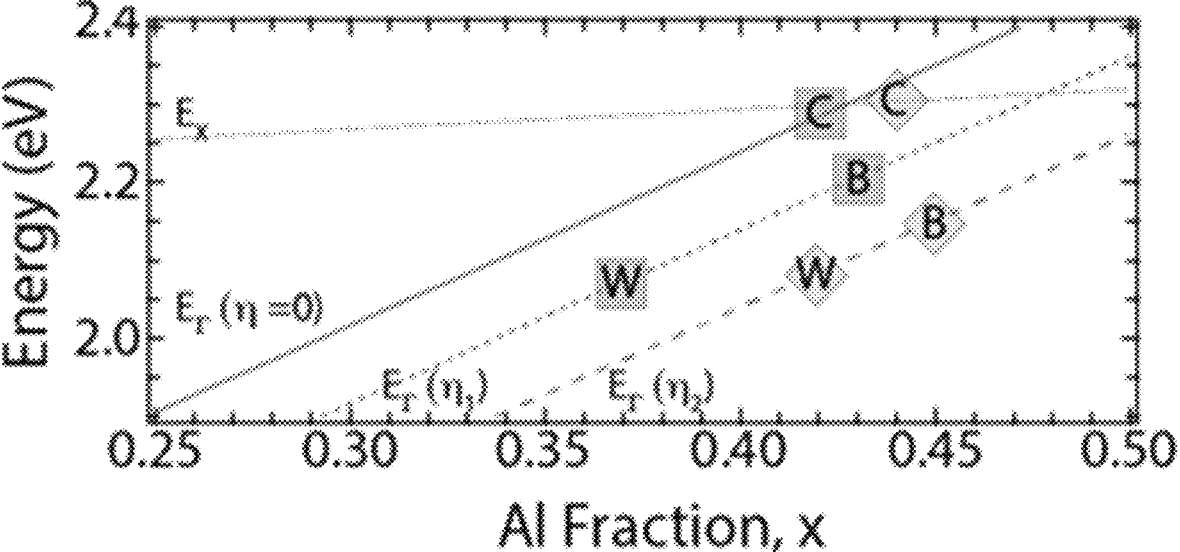
Figure 2C:
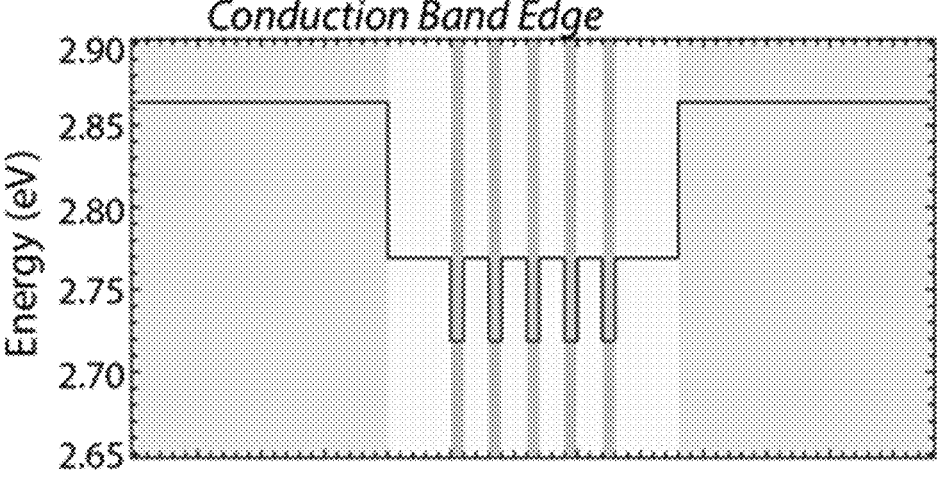
Figure 2C:
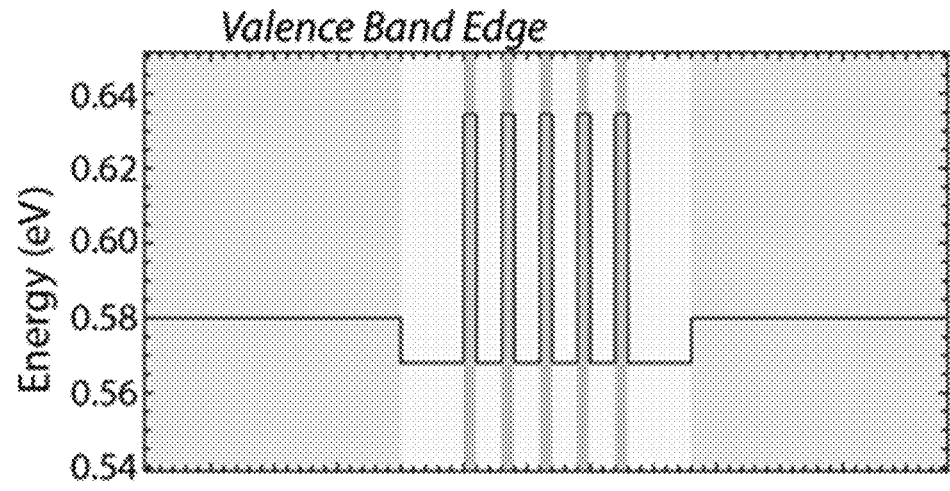
Figure 2C:
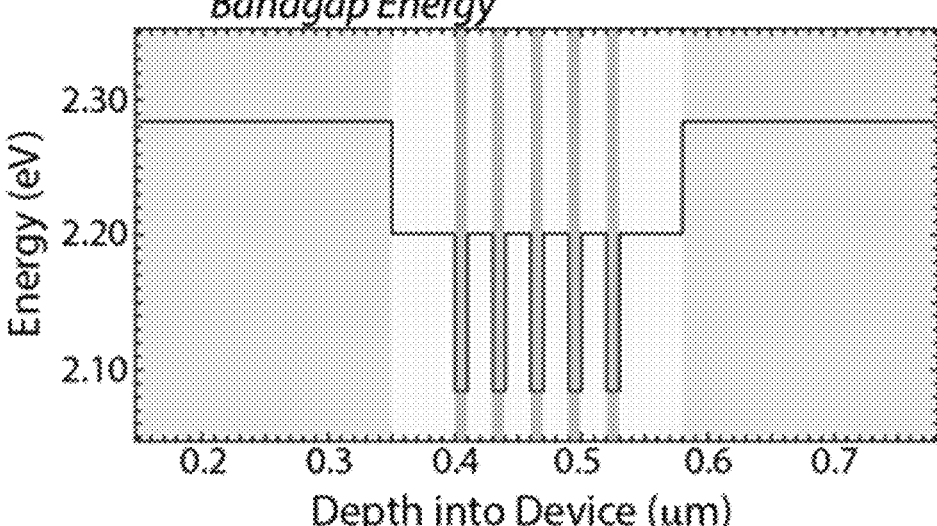
Figure 2D:
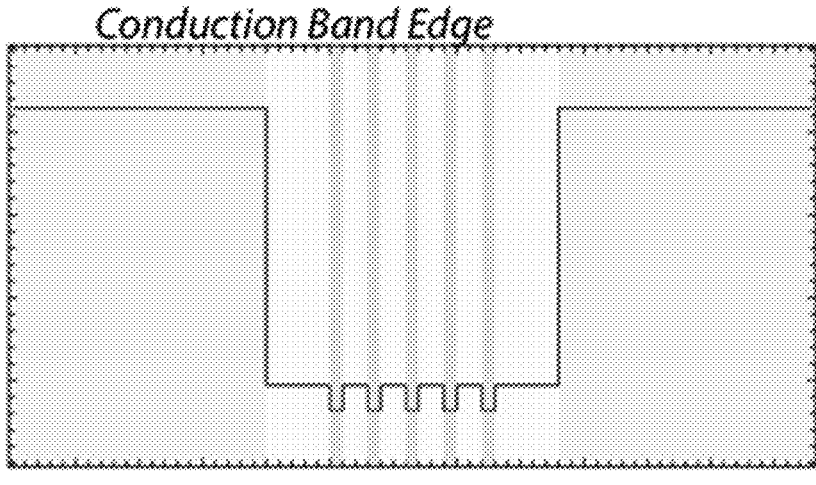
Figure 2D:
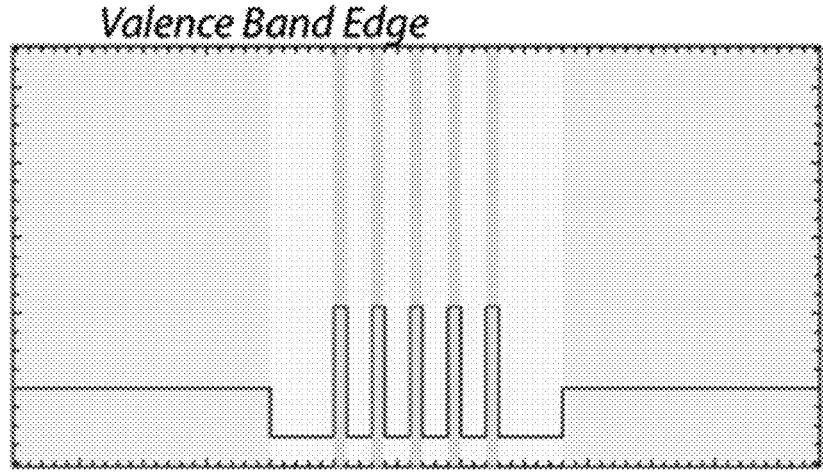
Figure 2D:
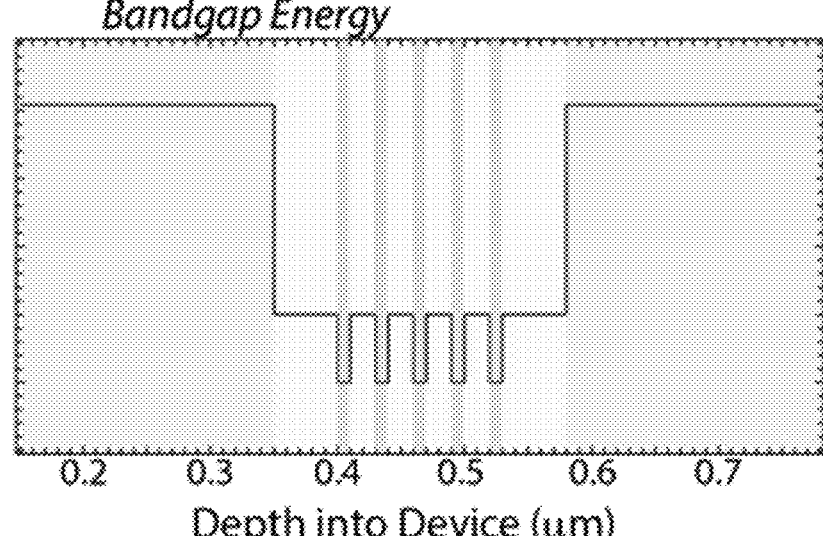

FIG. 2A displays a schematic of a representative ordered/disordered $Al_xIn_{1-x}P$ LED device, using a 5×MQW structure. The device itself is simplified for the purposes of examining the modified barrier energies that can be realized rather than optimizing the entire device operation. Two $Al_xIn_{1-x}P$ devices with different composition and ordering combinations were evaluated to illustrate how selection of both composition and ordering can affect the resulting strain and band offsets in the device. FIG. 2B graphically illustrates the compositions and bandgaps for the cladding, quantum well and barrier layers for both devices. FIGS. 2C-2D show the corresponding conduction and valence band alignments and bandgap energies as a function of depth into the devices. The intent of these calculations is to illustrate the energetic barriers that could be achieved in strain-balanced MQW devices as well as the fact that there are multiple pathways to achieve them. They therefore account for the influence of strain and quantum confinement in the 10 nm QWs but do not take into account the effect of extrinsic doping.

FIG. 2C depicts a device with $Al_{0.42}In_{0.58}P$ cladding layers, $Al_{0.37}In_{0.62}P$ quantum wells and $Al_{0.43}In_{0.57}P$ quantum barriers. The quantum wells and barriers are assumed to be ordered with an order parameter, $\eta_1$, that is large enough to induce a 100 meV of shift in $CBM_\Gamma$. The quantum well bandgap is 2.084 eV (595 nm) and the conduction band minimum offset between the quantum well and cladding layer is 145 meV. The slightly higher Al fraction in the quantum barriers compared to the cladding layers creates a small energy barrier (12 meV) to hole flow from the cladding layer into the outer quantum barrier.

FIG. 2D depicts a similar device in which the order parameter, $\eta_2$, induces a larger shift of 200 meV in $CBM_\Gamma$. The larger shift in the conduction band and bandgap energy in the quantum wells actually requires that less In be added to $Al_xIn_{1-x}P$ to achieve an emission wavelength of 590 nm, reducing the lattice mismatch that must be spanned by the metamorphic buffer layer. The quantum well layers now have a composition of $Al_{0.42}In_{0.58}P$, and compositions of $Al_{0.44}In_{0.56}P$ and $Al_{0.45}In_{0.55}P$ were selected for the cladding and quantum barrier layers to strain balance the quantum wells. As a consequence, the cladding layers have an indirect bandgap, which may affect various aspects of light absorption and electron transport. Given the decrease in $CBE_X$ with increasing Al concentration, this choice meant that some possible conduction band offset between the quantum well and cladding layers was sacrificed. However, the overall offset has increased to 182 meV compared to the first design. The differences in lattice constants between the cladding layers, quantum wells and barriers are also smaller, reducing the amount of strain that is generated between the quantum wells and barriers and the probability of strain relaxation and defect generation. The tradeoff is that the conduction band offset between the quantum wells and barriers is much smaller than the first device design.

Together, these two examples illustrate how the independent variables of ordering and composition can be selected within a strain-balanced MQW design to achieve a range of band offsets and total strain in the device. This exercise was not intended to optimize the full set of strain and band alignment parameters, and there are many more combinations that would also work. The major implication of the strain-balanced MQW design is that the degree of CuPt—B ordering in combination with the inclusion of compressive and tensile strain in the quantum wells and barriers, respectively, introduces an additional degree of design freedom. The compositions, thicknesses and degree of ordering of these layers can be specified to target certain conduction and valence band offsets, direct or indirect bandgaps, total strain in the device and the total lattice constant mismatch between the cladding layers and GaAs substrate. Additional degrees of freedom may also be accessed by lifting the strain balance requirement and allowing the buildup of net strain in the structure, provided it is below the threshold for relaxation through dislocation generation. In the following sections, described is an experimental demonstration of $Al_xIn_{1-x}P$ MQW LED devices and improvement of their performance.

In these examples, the quantum barrier and quantum well layers are assumed to have some degree of CuPt ordering (i.e. $\eta \neq 0$), and the cladding layers are assumed to have no ($\eta = 0$) ordering. Other designs are also possible, where the quantum well and barrier layers could be designed with different degrees of ordering (i.e. $\eta_{barrier} \neq \eta_{well}$) or no ordering. Likewise, the cladding layers may have non-zero ordering (i.e. $\eta \neq 0$).

steps may be added to minimize electron recombination at the LED side walls in the case where smaller dimensions are used.

Experimental Demonstration $Al_xIn_{1-x}P$ LED devices following the general design in FIG. 2 have been demonstrated on n-type (Si-doped $\sim 10^{18}$ cm$^3$) GaAs substrates miscut 6° toward the <111> A direction. This direction of miscut permits both variants of CuPt—B ordering to exist, while the degree of ordering is known to promote moderate degrees of ordering. Epitaxial growth of the $Al_xIn_{1-x}P$ LED device layers was carried out by metal organic chemical vapor deposition (MOCVD). The order parameter in each layer was controlled by a combination of substrate temperature, extrinsic dopants and surfactants. Higher substrate temperatures and extrinsic dopants helped to disorder the cladding layers, while lower substrate temperatures and the absence of extrinsic dopants in the active region promoted ordering. An extra measure was also taken to disorder the top cladding layer. Because desorption of the Zn dopant atoms was excessively high at temperatures needed to fully disorder $Al_xIn_{1-x}P$, a slightly lower substrate temperature was used in conjunction with an Sb surfactant. The growth conditions and layer characteristics are listed in Table 1. These conditions are representative, and a wide range of other growth conditions, dopant elements, surfactants, layer thicknesses, number of layers and contact layer materials could be used.

TABLE 1

| Characteristics and growth conditions of the device layers in a representative $Al_xIn_{1-x}P$ LED device. | | | | | |
|---|---|---|---|---|---|
| Layer | Composition, x | Thickness, nm | Temperature, ° C. | Dopant | Surfactant |
| $In_xGa_{1-x}As$ top contact | | 150 | 600 | Zn | None |
| $Al_xIn_{1-x}P$ top clad | 0.42 | 400 | 705 | Zn | Sb |
| $Al_xIn_{1-x}P$ outer barrier | 0.43 | 50 | 658 | None | None |
| $Al_xIn_{1-x}P$ QW x5 | 0.37 | 10 | 658 | None | None |
| $Al_xIn_{1-x}P$ inner QB x3 | 0.43 | 20 | 658 | None | None |
| $Al_xIn_{1-x}P$ outer barrier | 0.43 | 50 | 658 | None | None |
| $Al_xIn_{1-x}P$ bottom clad | 0.42 | 200 | 718 | Si | None |

One additional feature for introducing additional design freedom and reducing strain in the system is to add a small amount of gallium to the quantum wells, quantum barriers and/or cladding layers to engineer their bandgaps. Such compositions could be represented as $(Al_{1-y}Ga_y)_xIn_{1-x}P$. Increasing y will decrease the bandgap without substantially changing the lattice constant. One advantage is that a given emission wavelength can be achieved with a larger value of x, thereby reducing the lattice mismatch with the GaAs substrate. Another advantage is that the quantum wells and quantum barriers could be formed with a lower lattice mismatch between them, or even none at all. The one potential drawback would be a reduction in the indirect bandgap for increasing y, thereby reducing the energy barrier to electron loss to the indirect conduction band minima. However, such a trade-off may be attractive in cases where that energy barrier is already sufficient, and it is more important to manage lattice mismatches.

Finally, we note that these designs can be used for LEDs of any size, including dimensions of millimeters down to sizes of (sub-) microns. Additional features or processing $In_yGa_{1-y}As$ metamorphic buffer layers (MBL) were inserted between the GaAs substrates and device layers to increase the lattice constant from that of GaAs (5.65 Å) to that of a $Al_{0.42}In_{0.58}P$ bottom cladding layer (5.69 Å).

Devices were left on the metamorphic buffer layer/GaAs substrate structure for characterization and measurement of their electrical and light emission performances. The front and back contacts consisted of electroplated Au, and no current spreading or light-extraction features were added. In other embodiments, the GaAs substrate may be removed after the device layers are epitaxially grown to aid the incorporation of light extraction features.

Figure 3A:
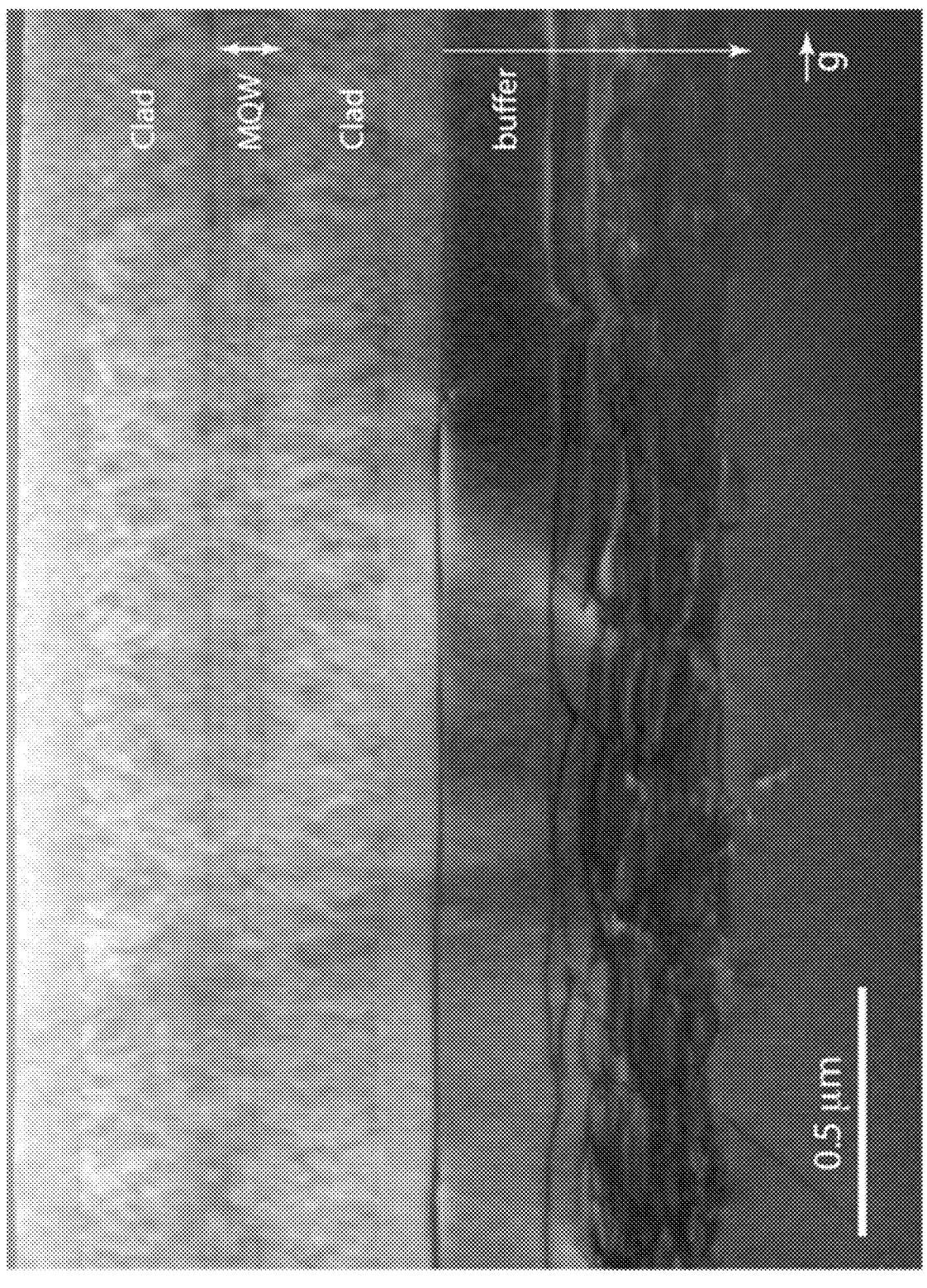
FIGS. 3A-3E illustrate LED device structural characteristics FIG. 3A. Cross-sectional TEM image of an Al$_x$In$_{1-x}$P LED/metamorphic buffer/GaAs substrate stack.
Figure 3B:
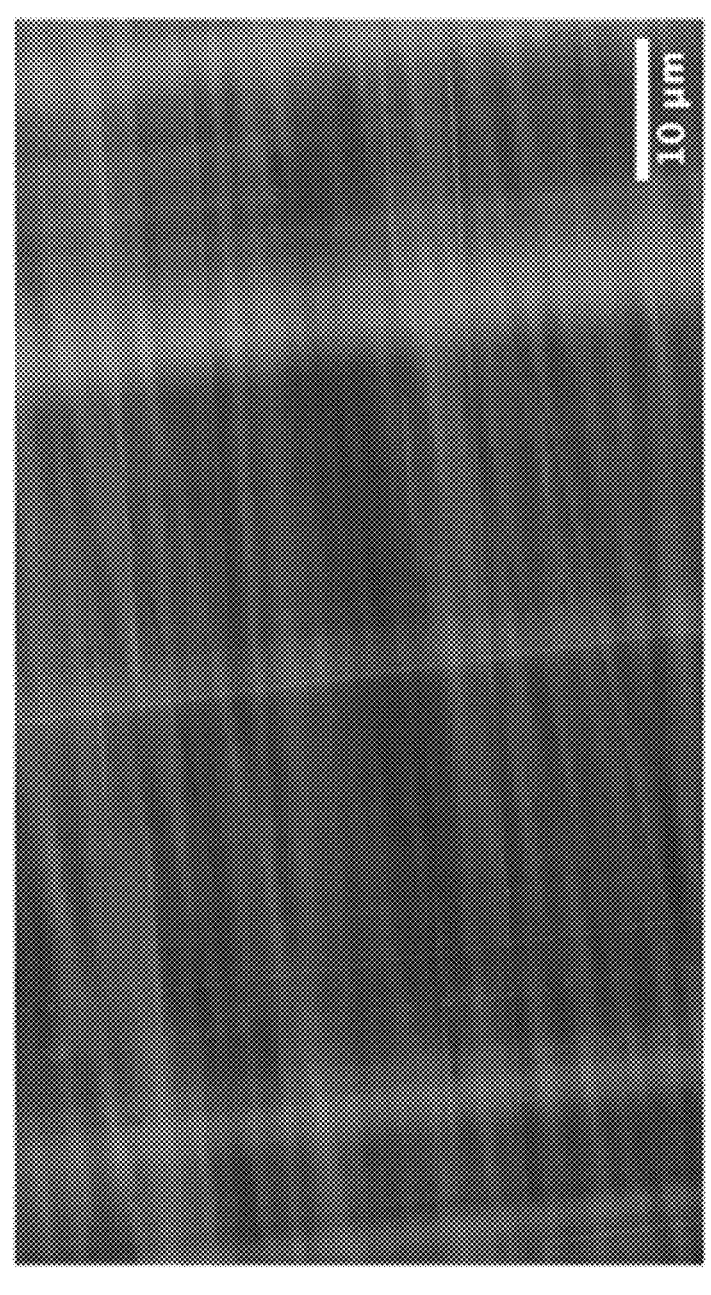

A critical factor in the performance of direct bandgap $Al_xIn_{1-x}P$ LED devices is the ability to confine strain-generated misfit dislocations to the metamorphic buffer and reducing the density of threading dislocations that reach the device layers. The cross sectional TEM image in FIG. 3A shows that misfit dislocations are mainly generated near the substrate interface as the lattice relaxes. The density of threading dislocations that reach the top surface of the buffer was determined to be in the range of $2\text{-}4 \times 10^6$ cm$^{-2}$ by ECCI measurements, shown in FIG. 3B.

Figure 3C:
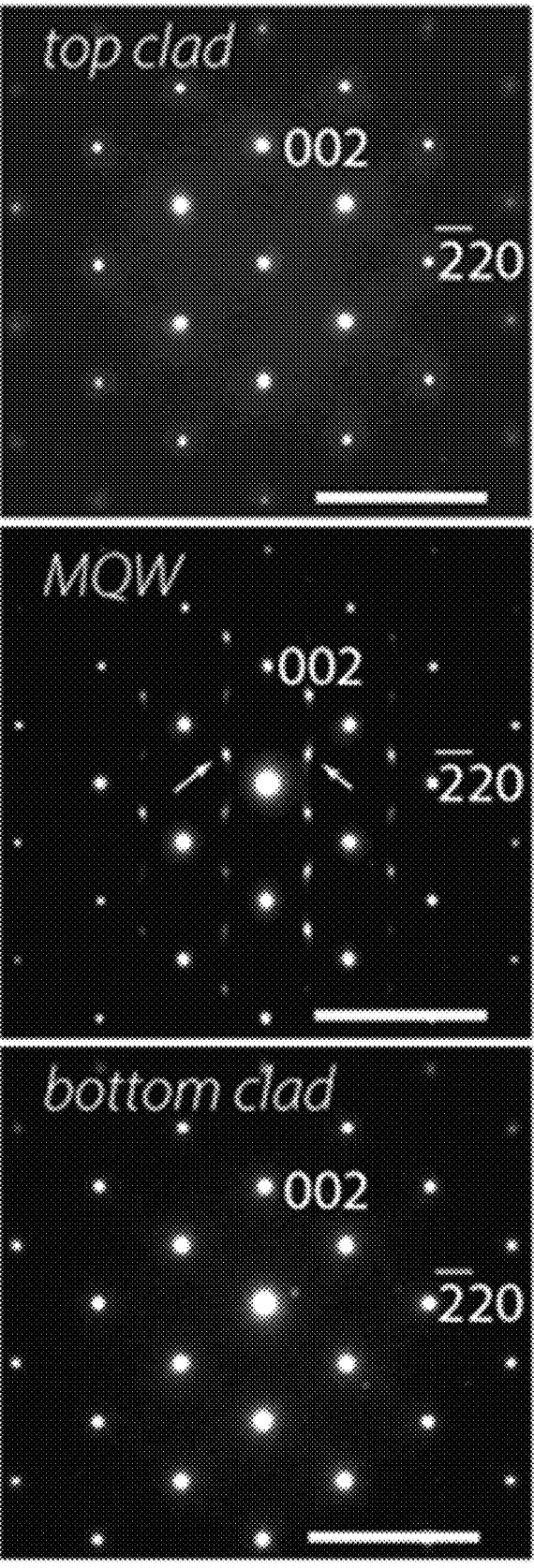
Figure 3D:
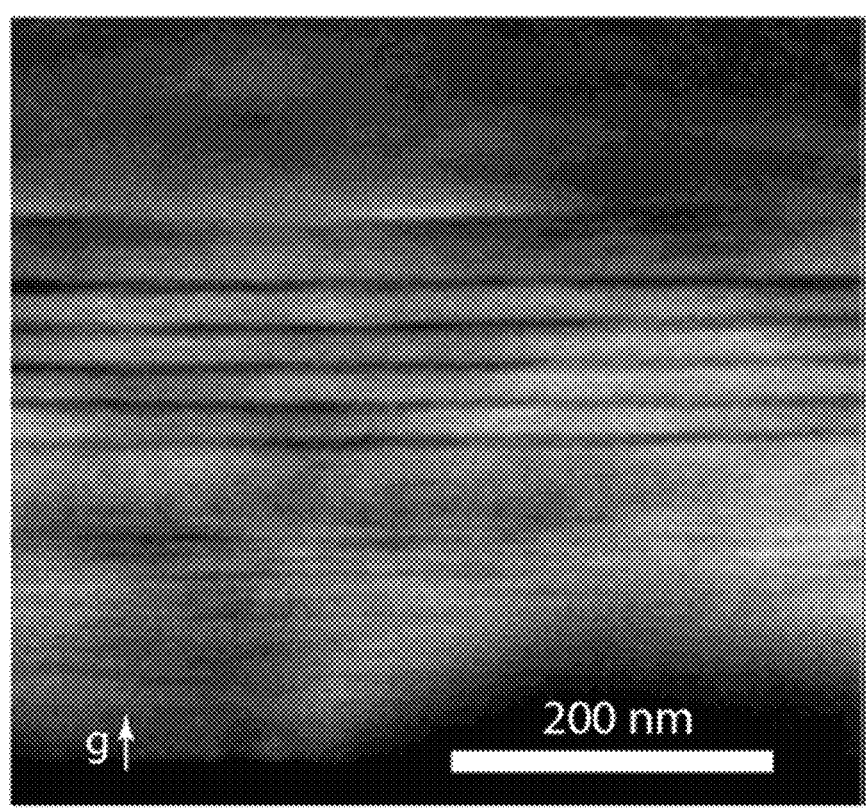

Analysis of the diffraction patterns in FIG. 3C qualitatively verifies the presence of atomic ordering of each layer. The diffraction pattern associated with MQW exhibits super-lattice spots that result from doubling of the unit cell upon ordering. By contrast, the diffraction patterns associated with the bottom and top cladding layers do not exhibit these superlattice spots, indicating that they are disordered. Additional detail about the MQWs can be observed in the magnified TEM image in FIG. 3D. The quantum well and barrier layers are unambiguously present. The quantum well thicknesses also meander slightly over the length scale of tens of nm.

Figure 3E:
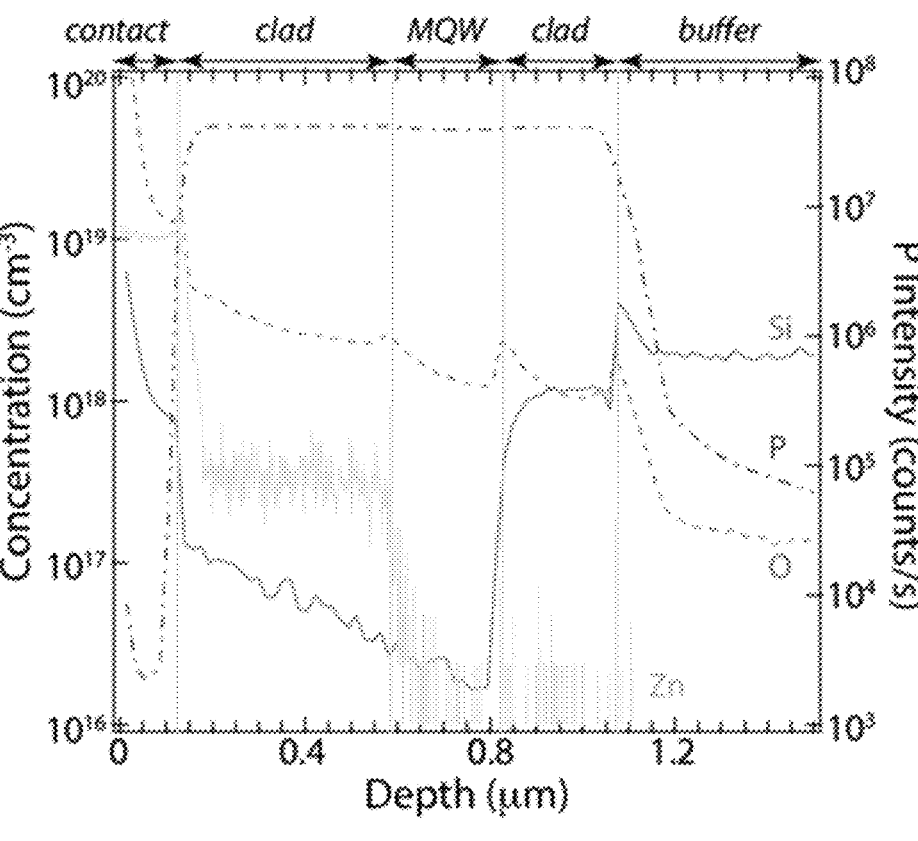

On the macroscopic scale, AFM measurements indicate that the surface height varies periodically over several microns (FIG. 3E). Surface undulations are first observed in the metamorphic buffer layer (left image), with peak to trough differences of ~25-30 nm. Further roughening occurs during growth of the $Al_xIn_{1-x}P$ device layers (right image). The full height variation increases only slightly to just above ~30 nm, although the texture changes. Formation of periodic undulations in surface height is known to occur during the growth of metamorphic graded layers. This phenomenon has been explained by variation in the growth rate caused by the local strain fields around misfit dislocations running parallel to the [−110] and [110] crystallographic directions. Once the surface undulations start in the metamorphic buffer layer, they are translated into the device layers.

The dopant and impurity concentrations in the device layers are assessed with SIMS in FIG. 3E. The signal intensity of P atoms is plotted on the right-hand axis to indicate where the $Al_xIn_{1-x}P$ device layers are located. The bottom n-type cladding layer is doped with ~$1\times10^{18}$ cm$^{-3}$ Si, while the top p-type cladding layer is doped with ~$5\times10^{17}$ cm$^{-3}$ Zn. The MQW was nominally undoped and contains a lower background concentration of both elements.

Figure 4A:
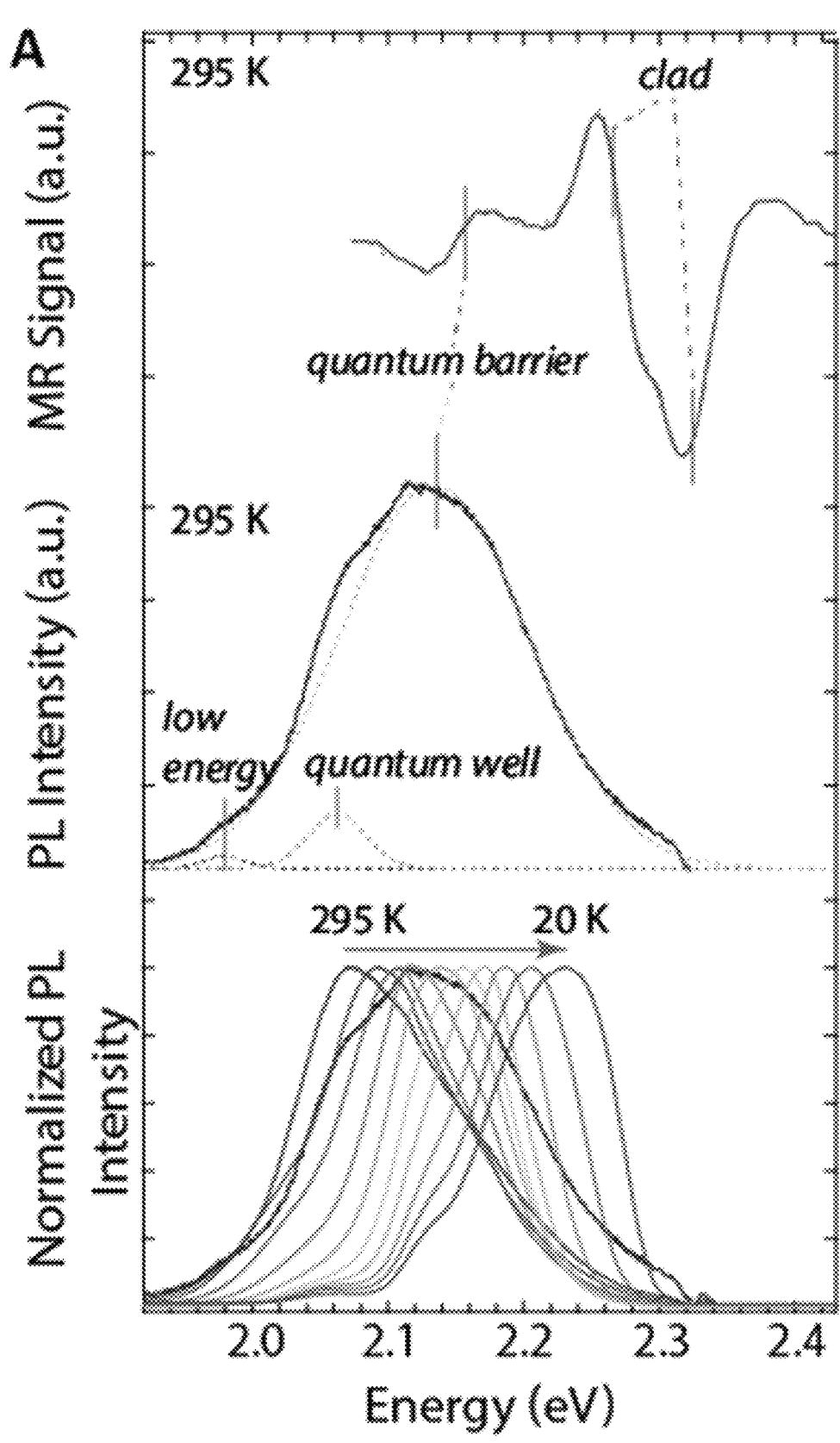
FIGS. 4A-4E provide Al$_x$In$_{1-x}$P LED device structural characteristics.

The bandgap energies of the layers in the $Al_xIn_{1-x}P$ device were determined through a combination of modulated reflectance (MR) and room temperature photoluminescence measurements (FIG. 4A). The MR spectrum exhibits three transitions associated with the direct bandgaps of the device layers. The lowest energy transition at 2.154 eV corresponds to the ordered quantum barrier layers. The two higher energy transitions at 2.267 and 2.324 eV likely correspond to disordered material. The targeted composition of the cladding layers is $Al_{0.42}In_{0.58}P$, with an expected disordered direct bandgap of 2.28 eV. These bandgap energies are higher than the quantum barriers by over 100 meV. Transitions from the quantum wells were not detected due to the comparatively lower amount of material in combination with their depth in the device.

The room temperature PL spectrum also exhibits a signature of the quantum barrier layers. Fits to the spectrum show that the peak luminescence energy (2.134 eV) is slightly below the energy determined from MR. The spectrum is dominated by PL from the barrier layers due to the total thickness of these layers (180 nm) relative to the total thickness of the quantum well layers (50 nm). The full width half maximum (FWHM) of the simulated peak associated with the quantum barriers is quite large (~170 meV), indicating a wide distribution of populated states in these layers. The room temperature PL spectra also includes two emission bands from the QW layers: one at 2.063 eV and one at 1.979 eV.

Figure 4B:
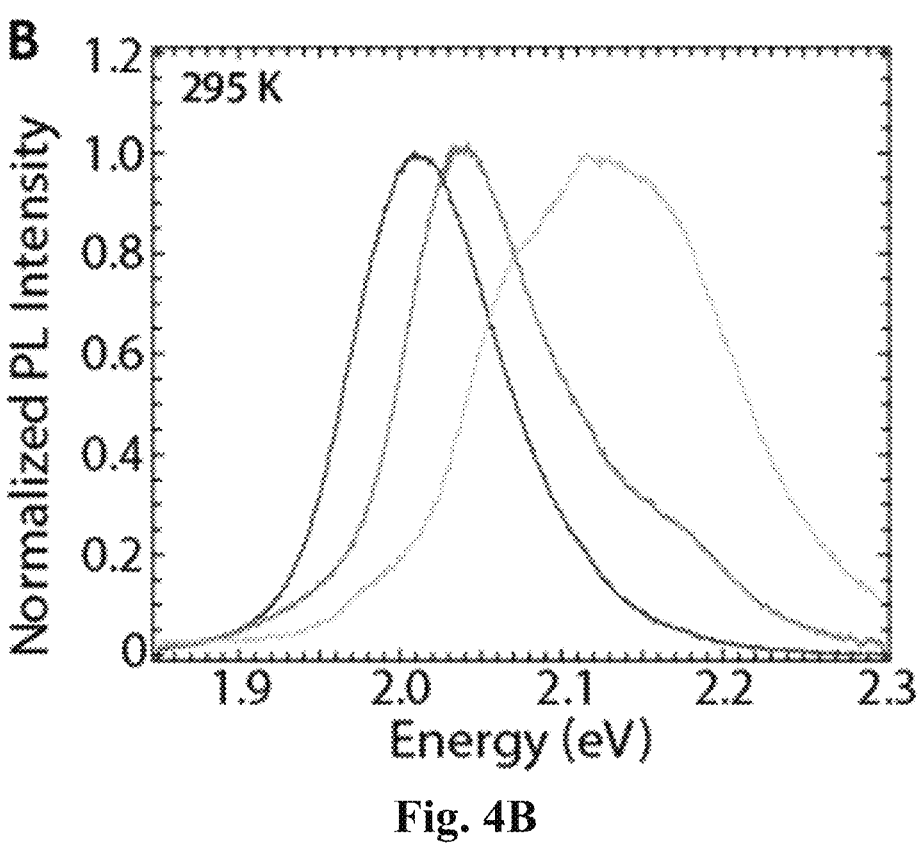

Photoluminescence spectra from three representative $Al_xIn_{1-x}P$ devices (including the one detailed in FIG. 4A) are displayed in FIG. 4B. The difference in these three devices is the compositions of the quantum well and barrier layers.

Importantly, the PL emission intensity increases from the quantum wells relative to the barriers as the emission energy decreases due to more efficient filling of the wells.

Figure 4C:
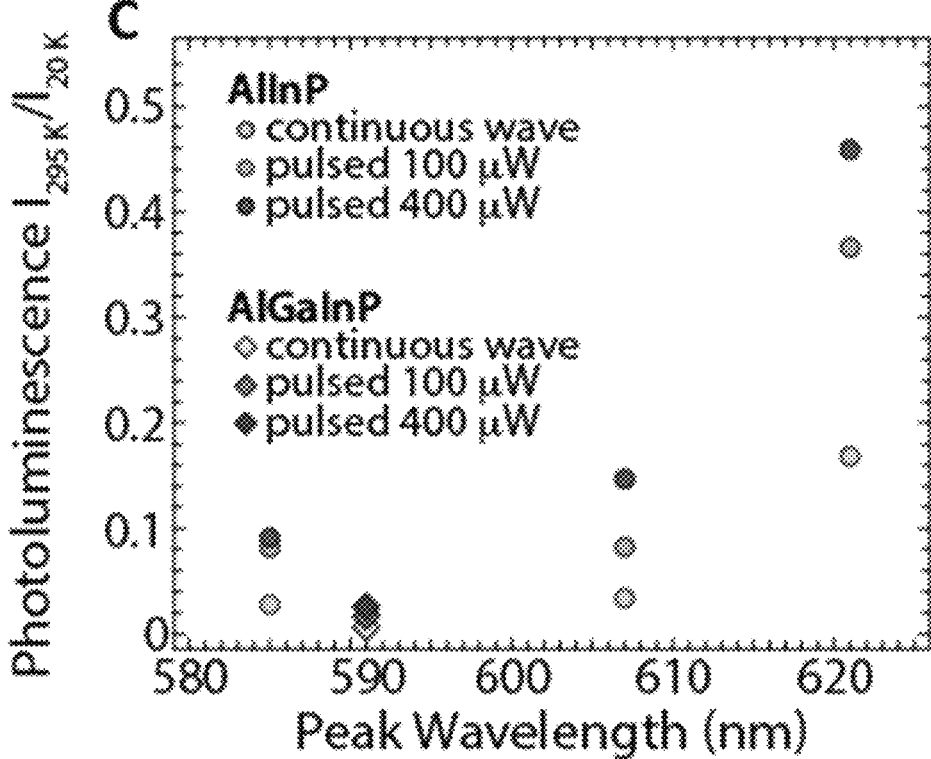

FIG. 4C displays the integrated PL intensity of these three devices measured at room temperature, divided by the intensity measured at 20 K. This ratio is often used as an approximate guide for the internal quantum efficiency, as non-radiative channels are expected to be frozen out at low temperature. Measurements were performed under three injection conditions: 1) a continuous wave laser operated at 30 mW, 2) a pulsed Ti:Sapphire laser operated at 100 mW and 3) a pulsed Ti:Sapphire laser operated at 400 mW, representing low, medium and high injection conditions, respectively. The ratio increases with increasing emission wavelength, as expected given the greater barriers to electron loss. The ratio also increases for all three devices with increasing optically injected carrier density. This behavior is consistent with progressive filling of the high density of non-radiative recombination centers (impurities and defects) that formed as the result of un-optimized growth conditions in this case. However, electron loss through the primary channels to indirect conduction band minima and the cladding layers still sets an upper limit to the performance gains.

Figure 4D:
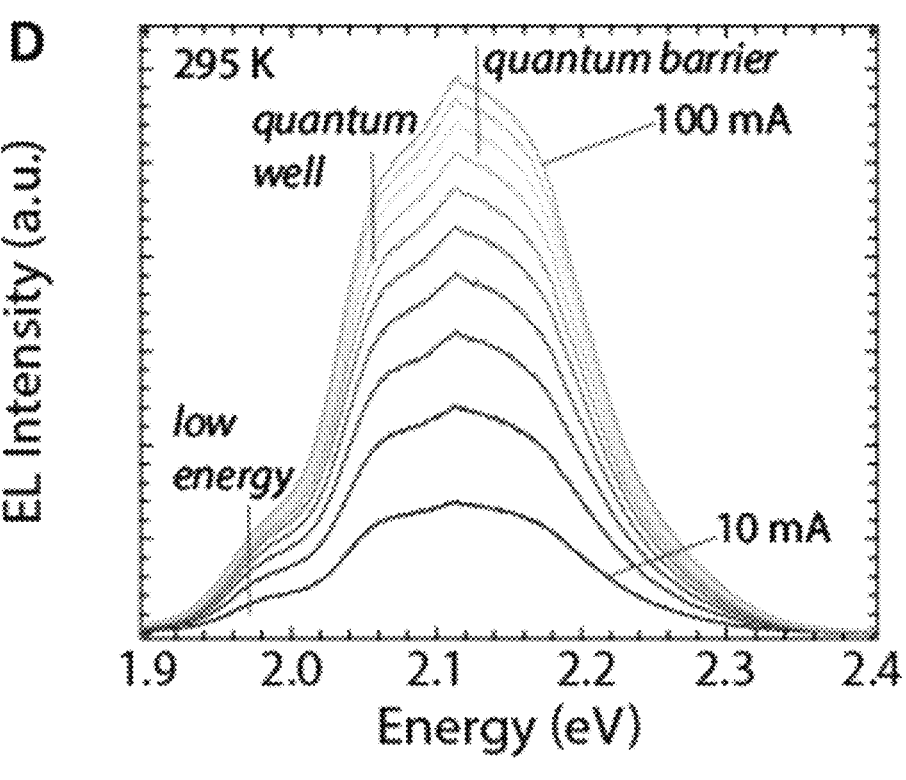
Figure 4E:
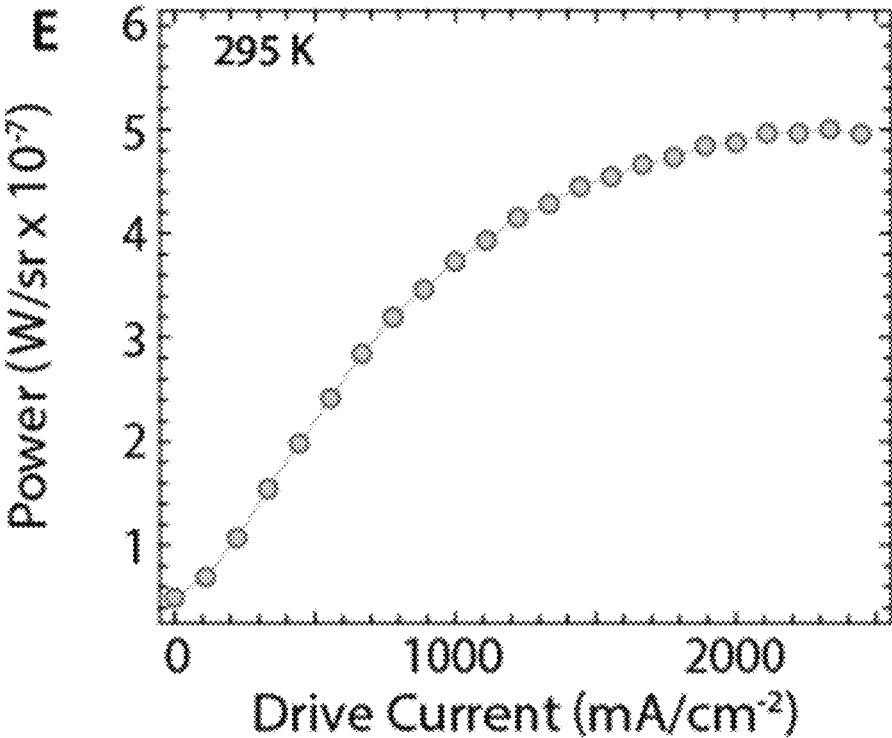
Figure 5:
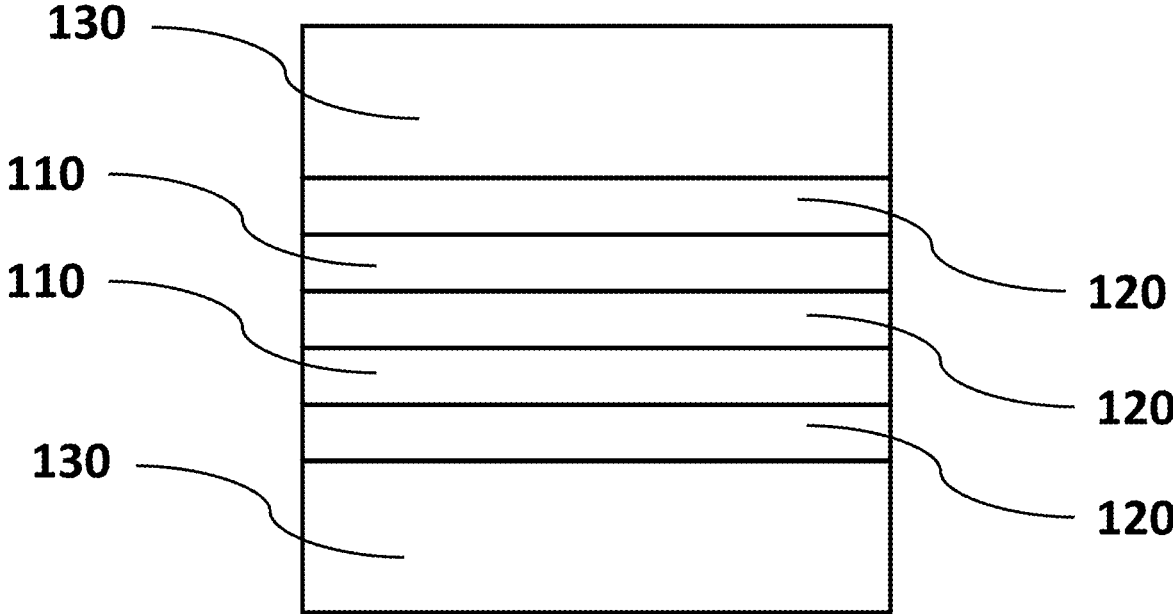
FIG. 5 provides an example schematic of an optoelectronic device 100 or LED as described herein. In this example, quantum well layers 110 are positioned in between quantum barrier layers 120 in an alternating configuration. Some embodiments may comprise a single quantum well layer and a single quantum barrier layer. The quantum well layers 110 and quantum barrier layers 120 comprise ordered AlInP. The device 100 may further comprise one or more clad layers 130, for example, n-type or p-type disordered AlInP.

Electroluminescence (EL) spectra of the same device featured in FIG. 4A is shown in FIG. 4D. The EL spectra also contain a sizeable contribution from the quantum barrier layers, and they do not change substantially with varying drive current. FIG. 4E displays the spectral power measured in an integrating sphere.

The $Al_xIn_{1-x}P$ LEDs evaluated here were also compared to an $(Al_xGa_{1-x})_{0.5}In_{0.5}P$ LED with a similar device structure. The device layers were grown directly on a lattice-matched GaAs substrate, and changes in the composition were used to define the cladding and MQW. The ratios of integrated PL intensities measured in the $(Al_xGa_{1-x})_{0.5}In_{0.5}P$ LED at room temperature and 20 K were also evaluated in a similar manner to the $Al_xIn_{1-x}P$ devices and are included in FIG. 4C. The ratios did not change appreciably across injection conditions, and the values did not exceed 0.026. This behavior can be explained by two factors. The lower density of carrier trap states limits the beneficial effect of higher injection densities on radiative recombination. At the same time, the lower energetic offsets between the direct and indirect conduction band edges in the quantum wells and the direct conduction band minima in the quantum wells and cladding layers permits a greater degree of electron loss. These loss pathways place a lower cap on the PL intensity ratio for $(Al_xGa_{1-x})_{0.5}In_{0.5}P$ vs $Al_xIn_{1-x}P$.

The predicted band alignments and experimental LED device performance indicate that $Al_xIn_{1-x}P$-based LEDs have the potential to improve upon the efficiency of incumbent $(Al_xGa_{1-x})_{0.5}In_{0.5}P$ devices based on increased energetic barriers to electron loss. The provided LED characterization supports this conclusion. The strain-balanced MQW design in combination with intentionally incorporating CuPt—B ordering offers flexibility to adjust the emission wavelength and band offsets between the quantum well and barrier layers without having to adjust the order parameter. Further refinement of the quantum well and barrier layer compositions and thicknesses will optimize the barrier heights and carrier confinement. The other main advantage of $Al_xIn_{1-x}P$-based LEDs is that they can be fabricated using the same infrastructure as commercially available $(Al_xGa_{1-x})_{0.5}In_{0.5}P$ devices. This includes the use of Mg dopant atoms instead of Zn to achieve optimal doping profiles throughout the device.

The present application may be further understood by the following non-limiting examples:

Example 1. An optoelectronic device comprising:

a well layer of ordered $Al_xIn_{1-x}P$ quantum wells;

a barrier layer of ordered $Al_xIn_{1-x}P$ quantum barriers in electronic communication with said well layer;

wherein said well layer and said barrier layer are strain balanced.

Example 2. The device of example 1, wherein the well layer comprises CuPt atomically ordered $Al_xIn_{1-x}P$ quantum wells.

Example 3. The device of example 1 or 2, wherein the well layer, the barrier layer or both are zero order.

Example 4. The device of any of examples 1-3 comprising a plurality of well layers and a plurality of barrier layers.

Example 5. The device of example 4, wherein said well layers and said barrier layers are in an alternating configuration.

Example 6. The device of any of examples 1-5 further comprising one or more $Al_xIn_{1-x}$ clad layers.

Example 7. The device of any of examples 1-6 further comprising a disordered $Al_xIn_{1-x}$ n-type clad layer and a disordered $Al_xIn_{1-x}P$ p-type clad layer.

Example 8. The device of any of examples 1-7, wherein strain balanced refers to a net strain between said well layers and said barrier layers is substantially zero.

Example 9. The device of example 8, wherein said well layers have a non-zero compressive strain and said barrier layers have a non-zero tensile strain.

Example 10. The device of any of examples 1-9, wherein said well layers have an Al fraction less than the Al fraction of said barrier layers.

Example 11. The device of any of examples 1-10, wherein said well layers, said barrier layers or both are capable of being grown on a GaAs substrate.

Example 12. The device of example 11, wherein said well layers, said barrier layers or both are grown on a GaAs substrate using an intermediate metamorphic buffer.

Example 13. The device of any of examples 1-12, wherein said well layers, said barrier layers or both further comprise Ga and have the formula $(Al_{1-y}Ga_y)_xIn_{1-x}P$.

Example 14. The device of example 13, wherein said Ga has a fraction less than or equal to 0.1.

Example 15. The device of any of examples 6-14, wherein said $Al_xIn_{1-x}P$ clad layers further comprises Ga and has the formula $(Al_{1-y}Ga_y)_xIn_{1-x}P$.

Example 16. The device of example 15, wherein said Ga has a fraction less than or equal to 0.1.

Example 17. The device of any of examples 1-16, wherein the device is capable of selectively emitting light at a wavelength selected from the range of 560 nm to 650 nm.

Example 18. The device of any of examples 1-17, wherein the device is a light emitting diode.

Example 19. A method for making the device described in any of examples 1-18.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure. For example, when a device is set forth disclosing a range of materials, device components, and/or device configurations, the description is intended to include specific reference of each combination and/or variation corresponding to the disclosed range.

Every formulation or combination of components described or exemplified herein can be used to practice the invention, unless otherwise stated.

Whenever a range is given in the specification, for example, a density range, a number range, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter is claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. An optoelectronic device comprising:
a well layer of ordered $Al_xIn_{1-x}P$ quantum wells;
a barrier layer of ordered $Al_xIn_{1-x}P$ quantum barriers in electronic communication with said well layer;
wherein said well layer and said barrier layer are strain balanced;
wherein said well layers have an Al fraction less than the Al fraction of said barrier layers.

2. The device of claim 1, wherein the well layer comprises CuPt atomically ordered $Al_xIn_{1-x}P$ quantum wells.

3. The device of claim 1, wherein the well layer, the barrier layer or both are zero order.

4. The device of claim 1 comprising a plurality of well layers and a plurality of barrier layers.

5. The device of claim 4, wherein said well layers and said barrier layers are in an alternating configuration.

6. The device of claim 1 further comprising one or more $Al_xIn_{1-x}P$ clad layers.

7. The device of claim 1 further comprising a disordered $Al_xIn_{1-x}P$ n-type clad layer and a disordered $Al_xIn_{1-x}P$ p-type clad layer.

8. The device of claim 1, wherein strain balanced refers to a net strain between said well layers and said barrier layers is substantially zero.

9. The device of claim 8, wherein said well layers have a non-zero compressive strain and said barrier layers have a non-zero tensile strain.

10. The device of claim 1, wherein said well layers, said barrier layers or both are capable of being grown on a GaAs substrate.

11. The device of claim 10, wherein said well layers, said barrier layers or both are grown on a GaAs substrate using an intermediate metamorphic buffer.

12. The device of claim 1, wherein said well layers, said barrier layers or both further comprise Ga and have the formula $(Al_{1-y}Ga_y)_xIn_{1-x}P$.

13. The device of claim 12, wherein said Ga has a fraction less than or equal to 0.1.

14. The device of claim 6, wherein said $Al_xIn_{1-x}P$ clad layers further comprises Ga and has the formula $(Al_{1-y}Ga_y)_xIn_{1-x}P$.

15. The device of claim 14, wherein said Ga has a fraction less than or equal to 0.1.

16. The device of claim 1, wherein the device is capable of selectively emitting light at a wavelength selected from the range of 560 nm to 650 nm.

17. The device of claim 1, wherein the device is a light emitting diode.

* * * * *